United States Patent [19]

Gabriel et al.

[11] 4,344,160
[45] Aug. 10, 1982

[54] AUTOMATIC WAFER FOCUSING AND FLATTENING SYSTEM

[75] Inventors: Fred C. Gabriel, Stamford; David A. Markle, Norwalk, both of Conn.

[73] Assignee: The Perkin-Elmer Corporation, Norwalk, Conn.

[21] Appl. No.: 146,532

[22] Filed: May 2, 1980

[51] Int. Cl.³ .............................................. G01S 15/88
[52] U.S. Cl. .......................................... 367/96; 72/11; 73/597
[58] Field of Search ................ 367/96; 73/1 DV, 105, 73/597, 598; 355/73, 76; 72/11, 12

[56] References Cited

U.S. PATENT DOCUMENTS

| | | | |
|---|---|---|---|
| 3,557,773 | 5/1971 | Kubo et al. | 72/11 |
| 3,729,966 | 5/1973 | Khoury et al. | 72/12 |
| 4,093,378 | 6/1978 | Horr et al. | 355/76 |
| 4,280,354 | 7/1981 | Wheeler et al. | 73/1 DV |

*Primary Examiner*—Richard A. Farley
*Attorney, Agent, or Firm*—S. A. Giarratana; E. T. Grimes; T. P. Murphy

[57] ABSTRACT

An automatic focusing system for positioning silicon or other wafer within the focal plane of a photolithographic mask projection system. The position of the wafer is measured at a plurality of points and compared to the position of an optical flat located in the focal plane to provide signals for positioning the wafer at the focal plane of the projection system. The system also includes means for changing the contours of the wafer to cause it to lie in a known plane.

10 Claims, 5 Drawing Figures

AUTOMATIC WAFER FOCUSING AND FLATTENING SYSTEM

BACKGROUND OF THE INVENTION

In certain types of integrated circuit fabrication circuit patterns on a mask are transferred to a semiconductor wafer by using a source of light or other form of radiation to project the circuit patterns onto the wafer which is coated with a light responsive photoresist material. The light is transmitted through an appropriate optical arrangement which among other things serves the function of focusing the light onto the wafer so that the circuit pattern lines are well defined as projected onto the wafer. In order to provide a high-resolution image on the wafer it is important that the wafer be accurately positioned within the focal plane of the projection optical system. Thus, a problem associated with photolithographic projection systems wherein an exposed wafer is constantly being replaced by an unexposed wafer is the accurate positioning of the wafer to be exposed in the focal plane of the optical projection system. This problem exists even in those systems where the wafer mount, projection optics and light source remain fixed because wafers are not flat or of uniform thickness and even the slightest deviation from the focal plane gives undesirable results.

Another problem associated with photolithographic projection systems is caused by the structural changes in the silicon wafers caused by the diffusion, oxidation and epitaxial processes used to create the circuit elements. Thus, a typical silicon wafer has an imperfectly flat surface which may contain a number of undulations. Such deviations from a perfectly flat plane also lessen the resolution of circuit patterns projected onto such a surface.

The present invention relates to a system which automatically positions the wafer in the focal plane of the projection system and automatically flattens the surface of the wafer.

BRIEF SUMMARY OF THE INVENTION

The present invention contemplates a system for automatically positioning a wafer within the focal plane of a photolithographic projection system and for automatically flattening the wafer relative to a known flat reference plane.

More particularly, the present invention contemplates a platen disposed substantially within the focal plane of the projection system. The platen is movable relative to the focal plane and is flexible so that it may be bent or distorted over its area so that a wafer securely mounted thereon likewise is movable with the platen relative to the focal plane and may be bent or distorted over its area at those points where the platen is bent or distorted.

Position sensors measure the position of the wafer at a plurality of points over its area and each measurement is compared with stored data which together represent the focal plane of the projection system. A computer using the sensed positional information and stored information provides error signals to a plurality of actuators attached to the platen to position the platen until the wafer is positioned within the focal plane of the projection system.

Similarly, a plurality of sensors determine position of the wafer surface and compares each measurement with stored data which represent a flat surface. The computer provides error signals to a plurality of actuators fixed to the platen which distort the platen at various points until the measured positions match the stored positions and the surface of the wafer matches the stored flat surface.

DESCRIPTION

Figure 1:
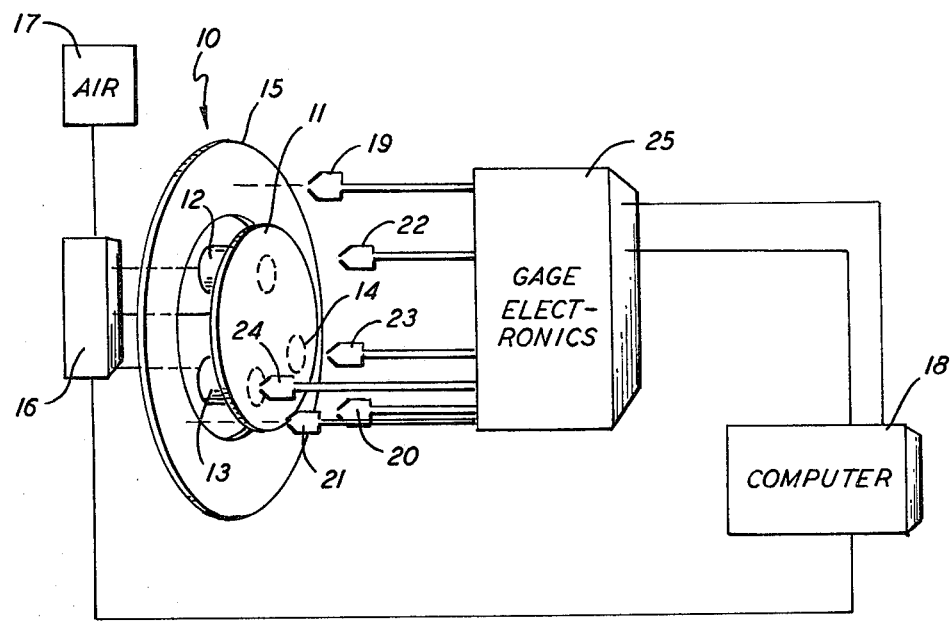
FIG. 1 illustrates partly in pictorial and partly in block diagram form a simplified version of the automatic focusing portion of the present invention.

FIG. 1 is broadly illustrative of the automatic focusing system of the present invention.

Figure 2:
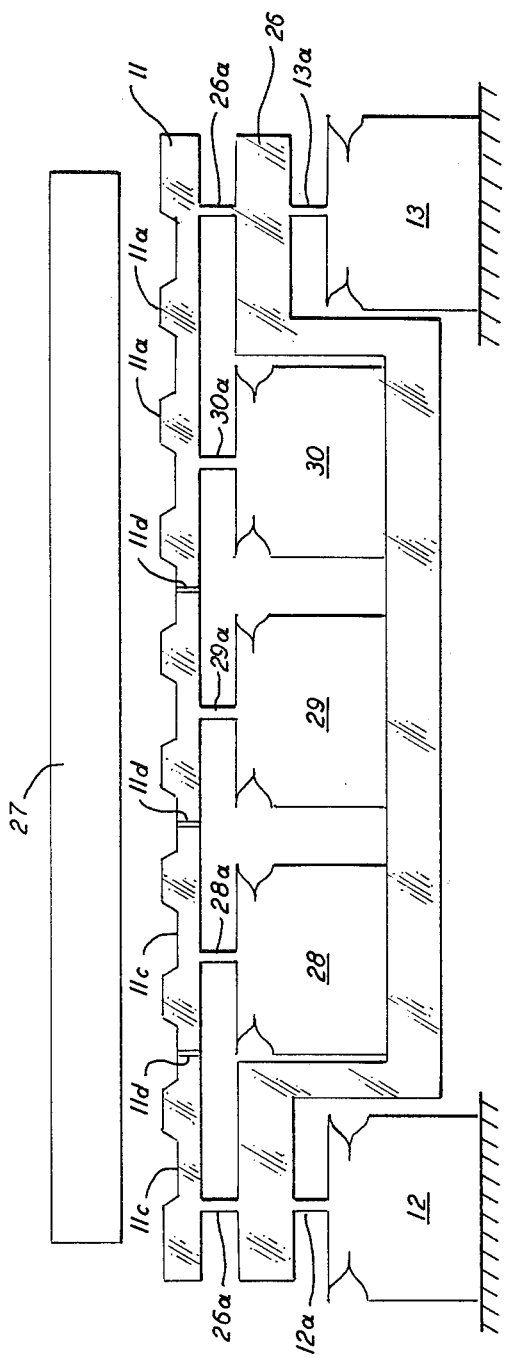
FIG. 2 is a side view partly in section of the chuck assembly of the present invention incorporating both the automatic focusing and automatic flattening actuators.

Reference numeral 10 indicates a chuck assembly better seen in FIG. 2. The chuck assembly 10 comprises a platen 11 which includes means, to be described more fully hereinafter, for securely holding thereto a wafer onto which circuit patterns from a mask are projected in a manner well known in the art. Also, the chuck assembly may be replaced by a glass reference flat, one surface of which defines the focal plane. As will be seen more clearly in reference to FIG. 2, the platen 11 is movable as a unit to permit it to cause a wafer fixed thereto to be moved as a unit about the focal plane of the projection printer.

The platen 11 is also capable of being bent and flexed at a plurality of points over its surface to thereby cause an attached wafer to be flattened in accordance with a known reference.

Pneumatic actuators 12, 13 and 14 are attached in a manner best seen in FIG. 2 in a way as to maneuver platen 11 and its associated wafer relative to a reference surface 15. A valve manifold 16 comprised of electrically operated valves connected to a source of air 17 has outputs connected to each of the pneumatic actuators 12, 13 and 14. The pneumatic actuators 12, 13 and 14 are controlled through the valves by a computer 18. In a practical embodiment computer 18 incorporates an Intel 8085 microprocessor. An array of ultrasonic displacement gages is disposed about the chuck assembly 10 for measuring the distance of an optical flat wafer or attached to the platen 11 with respect to the reference 15. Three displacement gages 19, 20 and 21 define the position of the reference 15 while three gages 22, 23 and 24 are used to define the position of the wafer or optical flat surface at any instant.

There are numerous ways in which an array of actuators and sensors can be disposed to focus and flatten a wafer. For example, each actuator may be connected to a flexible platen and a sensor can be placed opposite each actuator. Since the influence of one actuator on another is relatively small each actuator and its opposing sensor can be operated as an independent control system which drives that point on the wafer into best focus. But if the required motion is large and the response rates of the actuators differ appreciably from one actuator to the next then appreciable wafer bending can result during the focusing process. Furthermore, it is necessary to provide sufficient range and stiffness in each actuator to cover the combined requirements of focusing and flattening. By separating the focus and flattening actuators using the concept shown in FIG. 2 these problems are avoided and the focusing and flattening operations are separate and distinct. It is also possible to eliminate the flattening feature and to use a rigid platen mounted on 3 actuators which provide focus motion and 2 axis tilt capability. In order to provide the appropriate focus and tilt signals a minimum of 3 sensors is required but an array of sensors providing more or less equally spaced samples over the wafer surface is preferred. In the case of an array of samples the wafer position can be optimized on the basis of an RMS fit to the ideal focal plane position.

In one practical embodiment of this invention, which did not attempt to actively flatten the wafer, 7 displacement gages were used to sense the wafer position and the 3 platen actuators were adjusted on the basis of a RMS fit between the 7 wafer position sensors and the ideal focal plane position.

Figure 5:
FIG. 5 is illustrative of an RMS fit of a wafer within a projection system focal plane.

FIG. 5 illustrates a wafer in a position of RMS best fit in a focal plane. The undulations or imperfections in the surface of the wafer, of course, are greatly exaggerated for purposes of explanation. An RMS best fit is a best fit according to a well known criterion of a wafer within the focal plane taking into account the undulations present in the wafer's surface.

Three gages 19, 20 and 21 are sufficient to provide displacement data to the computer 18 for automatic placement of 3 points on the wafer in the focal plane of the projection system. If the wafer is not flat then additional gages can be used to obtain a more optimum wafer position using an RMS best fit of the wafer within the focal plane. In a preferred implementation of the present invention seven gages look at equispaced points on the wafer and the RMS best fit is computed by computer 18 using data provided by the seven displacement gages as well as the three gages 22, 23 and 24 ranging on the reference 15.

Computer 18 is a microcomputer and it stores in firmware form alogrithms for the automatic RMS best fit focusing. As broadly disclosed, the system described in reference to FIG. 1, functions in the following manner. A glass or other type of reference flat is substituted for the platen 11. The surface of the flat and later of the silicon wafer is sensed by the described array of ultrasonic gages to provide digital outputs to computer 18. Computer 18 compares the readings obtained from the glass flat with those from the wafer and calculates the required corrections. It then furnishes control signals to the valves contained in valve manifold 16 (to be described more fully hereinafter) which admit air to and-/or release air from the pneumatic actuators 12, 13 and 14 disposed for actuation of the platen 11. These actuators position the wafer 11 until it duplicates that of the reference optical flat. The computer averages a number of individual gage readings and computes the average to smooth out random error due to air turbulence and electrical noise. Reference surface 15 defines a reference plane to which all measurements are referred by the process of subtraction in the computer 18. Thus, although the gages actually sense the gage to wafer distances and the gage to reference distances the data are converted to wafer to reference plane distances. These stored data are invariable with respect to the position of the gage array itself allowing the gage array to be moved out of position when changing wafers and replaced with some finite error. The focusing operation is a reiterative process in which the error is reduced in several steps. After each step the wafer position is sensed again and another correction made. This continues until the error falls below a set limit, for example, one micron. The amount of correction applied per micron of measured error may be changed before each convergence step to minimize the total conversion time. This is equivalent to adjusting the gain of the closed-loop system during operation. FIG. 2 illustrates the chuck assembly 10 of FIG. 1 having independent focusing and flattening capability. It comprises a flexible platen 11 fixed to a rigid backing plate 26 at various points near the periphery of the platen 11 and indirectly attached through actuators at numerous other points. Two of the direct attachment points 26a and 26b are shown in FIG. 2. The platen 11 follows the movement of the backing plate when the backing plate 26 is moved as by the 3 focus actuators 12, 13 and 14. As discussed in reference with FIG. 1, there are three bellows actuators for the automatic focusing function of the present invention only two of the focus actuators 12 and 13 are shown in FIG. 2. The actuators 12 and 13 are shown fixed relative to backing plate 26 having their actuator elements 12a and 13a connected to the backing plate 26 which is moved thereby when the actuators are actuated on signals from the computer 18.

The actuators which flatten the wafer are mounted between the backing plate 26 and the platen 11 as shown in FIG. 2.

With respect to the automatic focusing embodiment of the present invention ten displacement gages plus three pneumatic actuators are used. The automatic focus and flattening embodiment of the present invention utilizes twenty-two displacement gages and 19 pneumatic actuators. It should be pointed out that none of these numbers are critical and focusing and flattening may be accomplished with more or less displacement gages and pneumatic actuators. However, the number of these devices used is related to the accuracy of the results. The numbers chosen represent a trade-off of efficiency versus cost and provide adequate results at an acceptable cost.

The platen 11 which is thin enough to be flexed and bent is of the "bed of nails" type comprising a plurality of projections 11a each terminating in a flat coextensive with the flat surface 11b formed at the outer pheriphery of the platen 11. Within the area of the platen 11 are of a large plurality of indentations 11c all communicating with one another in such a way that when a vacuum is applied as at openings 11d by vacuum source means (not shown) a wafer 27 is held securely in position on top of the platen 11.

A plurality of pneumatic actuators, only three of which 28, 29 and 30 are shown, are fixed to the backing plate 26. The actuating arms 28a, 29a and 30a of actuators 28, 29 and 30 are fixed as, for example, by electron-beam welding to the platen 11 which may be made of any suitable material e.g. a thin metal capable of being appropriately flexed and bent. These pneumatic actuators are used to flex and bend the platen 11 to cause the front surface of a wafer tightly coupled to the flexible platen by vacuum to conform to a known flat surface reference in a manner described hereinafter.

All of the pneumatic actuators are connected to a source of air through valve means yet to be described which are actuated by signals from the computer 18 to cause the actuating connections 26b, 26a, 28a, 29a and 30a to place the platen within the focal plane of the projection printer as well as to cause it to assume the contours of a known flat surface.

Figure 3:
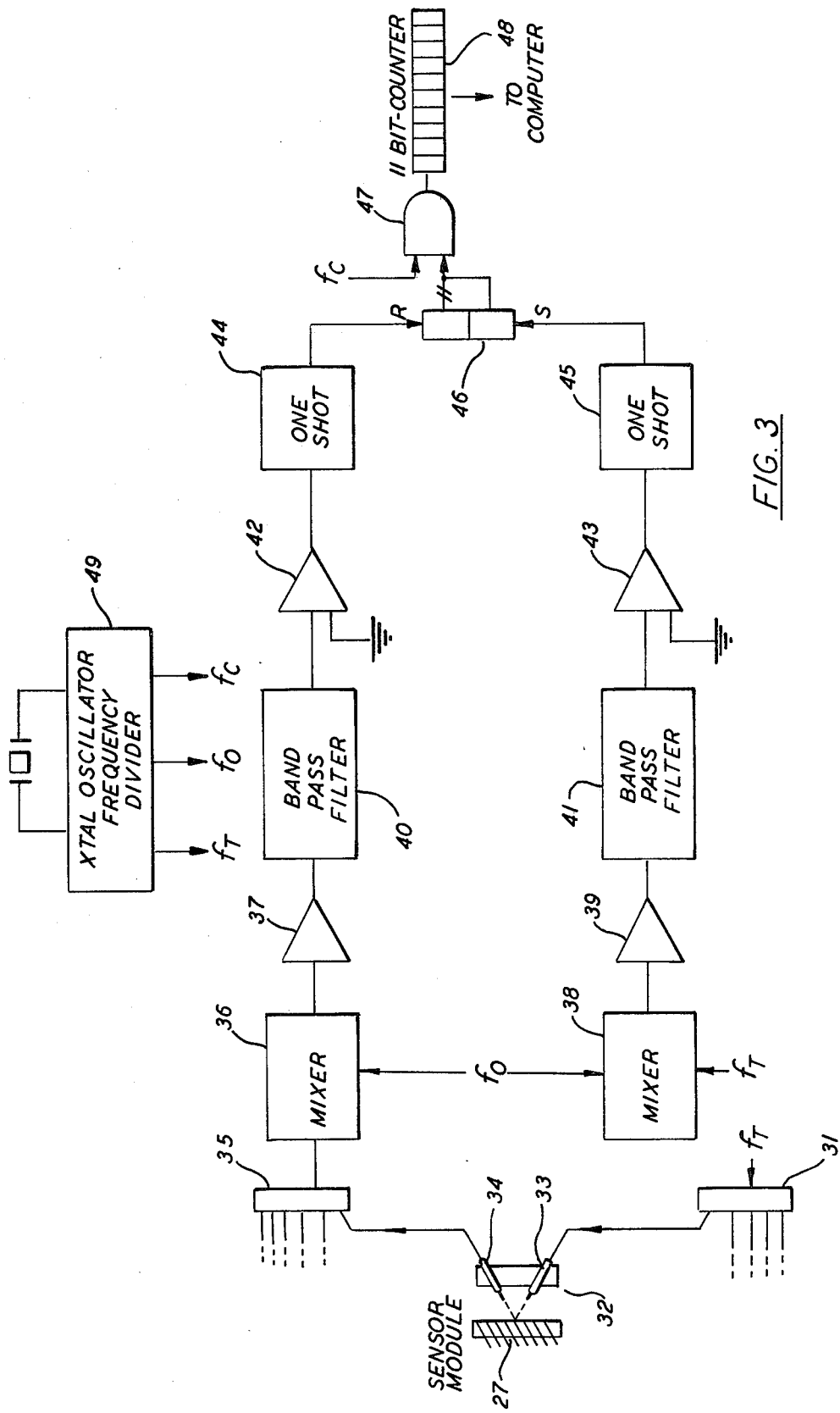
FIG. 3 is a block diagram illustrating the gage electronics of the present invention.

FIG. 3 illustrates the displacement gage electronics. The displacement gage electronics transmits a CW signal and receives a delayed echo, converting delay into a digital form capable of being manipulated and stored in a computer. The gage electronics is basically a phase detector wherein measurement of the phase difference between the transmitted wave and the received wave provides a measure of the distance. The ambiguity arising from the number of wavelengths between transmitter and receiver is of no consequence since the mechanical separation can be controlled to a small fraction of a wavelength.

The gage electronics includes a transmit multiplexer 31. The transmit multiplexer 31 is provided with an input having a transmit frequency imput $f_t$ which in a preferred embodiment is a 450 kilohertz sine wave. The transmit multiplexer 31 has a plurality of output terminals any one of which may be connected to the transmitter portion 33 of an ultrasonic displacement gage, depending on the channel selected.

For purposes of illustration only one displacement gage 32 is shown in detail although the number of displacement gages actually used for the automatic focusing embodiment is ten i.e. seven for the wafer and three for the reference. A transmitter portion 33 of displacement gage 32 converts the transmit frequency $f_t$ into an acoustical wave which is transmitted through the air until it hits a target such as wafer 27 or reference surface 15 where it is reflected and received by receiver portion 34 of the ultrasonic displacement gage 32 where it is converted back into an electrical sine wave transmitted and fed through multiplexer 35 to mixer 36. Multiplexer 35 selects one input from a plurality of displacement gages, the appropriate gage being selected electrically. The signal selected by multiplexer 35 is applied to mixer 36 which also receives an input frequency $f_o$ equal to 440 kilohertz. The mixer 36 functions as a hetrodyne converter wherein the sine wave inputs are converted down to a 10 kilohertz output which is applied as an input to amplifier 37. The transmit frequency $f_t$ is also applied to a mixer 38 along with frequency $f_o$ to provide an output sine wave converted down to 10 kilohertz. The output of the mixer 38 is applied to amplifier 39. Each of the outputs of amplifiers 37 and 39 are applied as inputs, respectively, to band-pass filters 40 and 41 which eliminate noise from the signals. The outputs from filters 40 and 41 are applied as inputs to comparators 42 and 43, respectively. The outputs from comparators 42 and 43 are applied as inputs to one shot multivibrators 44 and 45 respectively. The comparators 42 and 43 function to convert the sine wave input thereto to a square wave output and function essentially as clippers.

The outputs of one shot multivibrators 44 and 45 are connected to the reset and set inputs of a flip-flop 46. The output of the set side of flip-flop 46 is connected as an input to AND gate 47. AND gate 47 is connected to counter 48 which counts the bits represented by frequency $f_c$ during the time that flip-flop 46 is in the set condition providing a high to AND gate 47. Thus, between positive zero crossings of the transmitted and received waves the flip-flop 46 is set and reset and the counter 48 records a binary number indicative of the distance between the displacement gage 32 and wafer 27 or optical flat. This process may be repeated a number of times to provide an average count which is then stored in the computer memory. As aforesaid, three displacement gages 22, 23 and 24 range on a reference ring which defines a reference plane to which all measurements are referred to by the process of substraction in the computer. Thus, although the gages actually sense the gage to wafer distances and the gage to reference pad distances, the data are converted to wafer-to-reference-plane distances. These are invariant with respect to the position of a gage array itself allowing the gage array to be moved out of position and replaced with some finite position error.

Through the use of well known multiplexing techniques, information relating to the distances of each individual displacement gage from its reference or wafer are sequentially measured and appropriately stored in the computer.

The various frequencies provided by crystal oscillator and frequency divider 49 are the frequency outputs $f_t$, $f_o$ and $f_c$. Frequencies $f_t$ and $f_o$, as aforesaid, are 450 kilohertz and 440 kilohertz which by means of hetrodyne mixers 36 and 38 provide a 10 kilohertz output which is filtered clipped and provided as an input to one shot multivibrators 44 and 45 to produce the set and reset pulses for flip-flop 46 which define the time interval or from another viewpoint the phase difference which is measured by the amount of time the flip-flop is turned on to count frequency $f_c$. Frequency $f_c$ may be any value sufficiently large to give an accurate measurement of the time interval.

In the foregoing manner all the reference information necessary to provide automatic focusing is stored in the computer memory. This stored information is then used to compare actual position of the wafer as measured by the displacement gages with stored reference information to provide error signals to the various pneumatic actuators to automatically position the wafer in the focal plane of the projection system.

For automatic focusing of a wafer within the focal plane three pneumatic actuators 12, 13 and 14 are used which are actuated by valves controlled by signals from the computer 18 to raise, lower, and/or tilt platen 11 by manipulating backing plate 26 accordingly, until wafer 27 lies within the focal plane in a RMS best fit.

As aforesaid, the displacement gage electronics as discussed with reference to FIG. 3 is an interval timer which measures the time interval of the phase displacement between the transmitted and received acoustic waves. In this sense it may also be considered a phase meter.

In order to avoid ambiguous range readings, the frequency of the transmitted acoustic sine wave must have a wavelength compatible with range. In practice, a frequency of 450 kilohertz yields a non-ambiguous range of about 400 microns. Beyond this range the phase measurements exceed 360° and repeat unless additional circuitry is employed.

Also, it should be noted that it is desirable to use a small diameter or aperture of the transmitting transducer of the displacement gage i.e. of the order of two wavelengths in air relative to the transmitting wavelength to cause diffraction-induced spreading of the transmitted beam. This prevents the beam from translating laterally off the receiving transducer as the range varies and also makes the gage tolerant of angular tilt of the surface of the wafer or glass flat.

If the diameter or aperture of the transmitting transducer were large, the transmitted and returned beams would be narrow causing the returned beam to translate off the receiving transducer for targets not within a fairly small range.

Thus, a large beamwidth provided by a small transducer aperture irradiates the receiving transducer at close and long ranges and is more tolerant of transducer misalignment.

Figure 4:
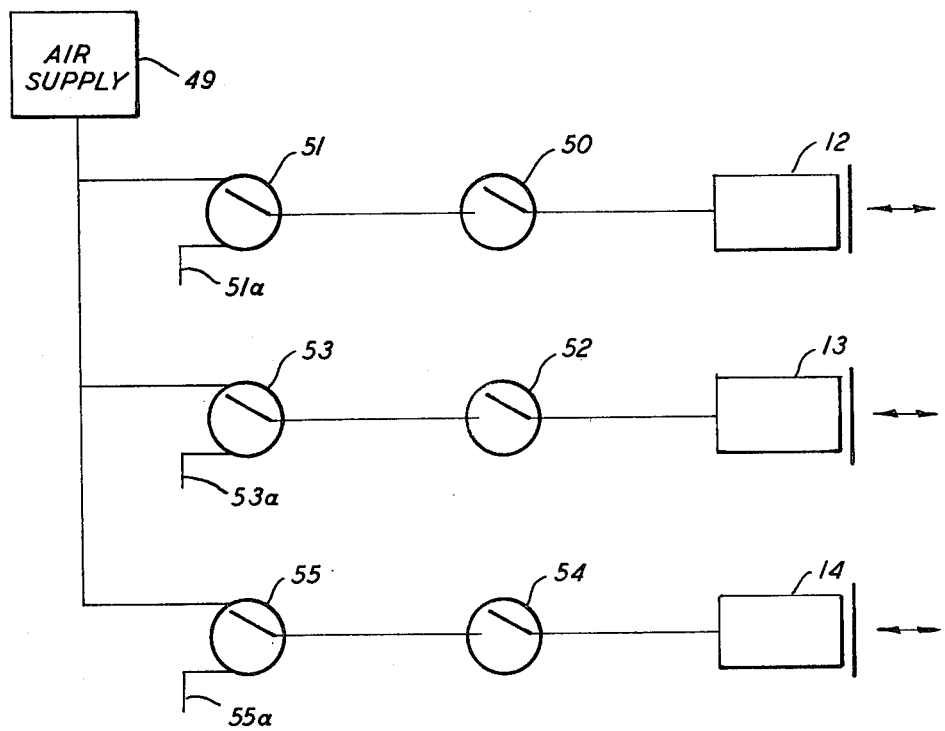
FIG. 4 is a block diagram showing a portion of the pneumatic system of the present invention.

FIG. 4 is illustrative of the pneumatic actuating system for the automatic focusing system of the present invention. While FIG. 4 shows three pneumatic actuators for use in the automatic focusing system, the automatic flattening portion of the present invention may use sixteen or more separate pneumatic actuators. While the pneumatic actuating system depicted in FIG. 4 is described with reference to the automatic focusing system, it should be remembered that the pneumatic actuating system for the automatic flattening feature of the present invention functions in a similar manner except that it uses more pneumatic actuators.

The pneumatic actuating system of FIG. 4 comprises three bellows type actuators 12, 13 and 14 arranged in a manner best seen in FIG. 2 for positioning platen 11 by movement of the backing plate 26 to effect movement of the wafer 27 to the focal plane.

The pneumatic actuators 12, 13 and 14 are connected to the source of air 17 via valves 50 and 51, 52 and 53, and 54 and 55, respectively.

In a practical embodiment, the source of air 17 provides air at a nominal pressure of 50 PSI relative to atmospheric pressure. The pneumatic actuators 12, 13 and 14 are of a commercial type, e.g. of a type sold by Metal Bellows Company, Sharon, Ma. or Kinemotive Corporation, Farmingdale, N.Y. Each of the pneumatic actuators 12, 13 and 14 contain a reservoir of air, the amount of which determines how far each moves from a given input of air, that is, the bigger the reservoir, the less movement is made by the bellows of the pneumatic actuators. The valves 51 through 55 are controlled by signals from the computer 18 by means of, for example, solenoids (not shown). The valves 50, 52 and 54 are fast acting and in a preferred embodiment have one millisecond response time. In the position shown in FIG. 4, the reservoir of air in each of the actuators 12, 13 and 14 remains constant. In their operative position, that is, opposite from the position shown in the Figure, either air supply 17 is connected to the actuators 12, 13 and 14 or the reservoir of air in the pneumatic actuators 12, 13 and 14 is connected to atmosphere via dumps 51a, 53a and 55a. The valves 51, 53 and 54 are shown connected to the air supply 17 whereas when in the opposite position, they are connected to the dumps 51a, 53a and 55a.

The valves 51, 53 and 55 are slow acting relative to valves 50, 52 and 54 and have e.g. a five millisecond response time. The valves 51, 53 and 55 are set in advance since being relatively slow acting, their actuation has to be completed before the fast acting valves 50, 52, and 54 are set.

The computer 18 by comparing current distance measurements with stored reference values makes the decision with the aid of the stored algorithm as to which pneumatic actuators 12, 13 and 14 push and which pull and the length of time of actuation. Each time the wafer is positioned the gages make another measurement for comparison to the stored reference values. This process is repeated several times until the error is within a predetermined acceptable range.

With the use of seven displacement gages, the fit obtained within the focal plane by the wafer 27 is a RMS best fit which as aforesaid is accomplished by means of an algorithm stored in the computer memory. The algorithm operates the valves so that each 2 way valve is connected to the supply pressure or the exhaust depending on the direction of travel desired. It then opens each 2 way valve for a time proportional to the desired correction magnitude. As aforesaid, the auto-flattening feature of the present invention utilizes a pneumatic actuating system similar to that of FIG. 4 with the difference that additional actuators are provided to bend and shape the wafer. In a preferred embodiment 22 displacement gages are used in conjunction with 19 pneumatic actuators. The displacement gages range at various points on the wafer to provide error signals when compared with previously measured stored data representative of a flat surface. FIG. 2 illustrates three pneumatic actuators 28, 29 and 30 which are fixed to backing plate 26 and have extensions 28a, 29a and 30a fixed to the platen 11 so that when pneumatic actuators 28, 29 and 30 plus the many actuators not shown are energized, in accordance with error signals produced by comparison of measured values with stored values, flex and bend the platen 11 and hence the wafer 27 until its measured flatness conform within a predetermined goal. Thus, by use of the algorithms for the auto-focusing and auto-flattening systems of the present invention an RMS best fit of the wafer within the focal plane is obtained and automatic flattening of the wafer is obtained. While the program associated with this system is not part of the invention per se, it is disclosed hereinafter attached as an appendix for the purpose of providing a complete disclosure. Also attached is a copy of the flow chart of the routines performed by the system of the present invention.

We claim:

1. A system for automatically positioning a wafer within the focal plane of an optical system comprising in combination, platen means for holding the wafer, a source of frequency, sensor means providing output signals indicative of the position of the wafer, said sensor means comprising, a plurality of ultrasonic displacement gages disposed adjacent said platen means, each of said gages comprising a transmitting and receiving element, means connecting each of said transmitting elements to said source of frequency for transmitting acoustic waves for reflection by the wafer back to said receiving elements, each of said transmitting elements having an aperture size to insure that the reflected waves are received by said receiving elements, storage means storing data representative of the focal plane, comparator means connected to said sensor means and said storage means providing first output signals representative of deviation of the wafer from the focal plane, first actuator means connected to said platen means and said comparator means for moving said platen means until said first signals fall below a predetermined amount.

2. A system according to claim 1 wherein, said storage means stores data representative of a flat surface, said sensor means providing output signals indicative of the flatness of the wafer, second actuator means connected to said platen means and said comparator means, said comparator means providing second output signals representative of deviation of the surface of the wafer from said stored flat surface, second actuator means connected to said platen means and said comparator means for bending the wafer at selected points until said second signals fall below a predetermined amount.

3. A system according to claim 1 wherein said platen means comprises, a platen, a backing plate fixed to said platen, said first actuator means fixed to said backing plate for moving said backing plate and platen as a unit.

4. A system according to claim 2 wherein said platen means comprises, a platen, a backing plate fixed to said platen, said first actuator means fixed to said backing plate for moving said backing plate and platen as a unit.

5. A system according to claim 4 wherein, said second actuator means are disposed between said platen and said backing plate for flexing said platen at selected points thereon.

6. A system according to claim 5 wherein, said platen is made of thin, flexible material such that flexing thereof flexes the wafer.

7. A system according to claims 1 or 3 wherein said sensor means further comprises, electronic circuit means connected between each of said receiving elements and said comparator means providing input data thereof representative of the distance between said gages and the wafer.

8. A system according to claims 2, 4, 5 or 6 wherein said sensor means further comprises, electronic circuit means connected between each of said receiving elements and said comparator means providing input data thereto representative of the flatness of the surface of the wafer.

9. A system according to claim 7 wherein said first actuator means comprises, a plurality of pneumatic actuators connected between mechanical ground and said backing plate, a source of air, conduit means connecting said source of air to each of said pneumatic actuators, valve means disposed in said conduit means and responsive to signals from said comparator means to operate each of said actuators to move the wafer to fit within the focal plane of the system.

10. A system according to claim 8 wherein said second actuator means comprises, a plurality of pneumatic actuators connected between said backing platen and said platen for flexing said platen and the wafer at selected points to, a source of air, conduit means connecting said source of air to each of said pneumatic actuators, valve means disposed in said conduit means and responsive to signals from said comparator means to operate each of said actuators to flex said platen at selected points to cause the surface of the wafer to assume the shape of said stored flat surface.

* * * * *